United States Patent
Sorensen et al.

(10) Patent No.: US 9,837,390 B1
(45) Date of Patent: Dec. 5, 2017

(54) SYSTEMS AND METHODS FOR CREATING FLUIDIC ASSEMBLY STRUCTURES ON A SUBSTRATE

(71) Applicant: Corning Incorporated, Corning, NY (US)

(72) Inventors: Michael Lesley Sorensen, Waverly, NY (US); Sean Mathew Garner, Elmira, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 15/344,736

(22) Filed: Nov. 7, 2016

(51) Int. Cl.
| | |
|---|---|
| H01L 25/075 | (2006.01) |
| H05K 3/10 | (2006.01) |
| H05K 3/30 | (2006.01) |
| H05K 3/28 | (2006.01) |
| H05K 1/18 | (2006.01) |
| H01L 33/54 | (2010.01) |
| H01L 33/62 | (2010.01) |
| H05K 1/11 | (2006.01) |
| H01L 33/56 | (2010.01) |

(52) U.S. Cl.
CPC ......... *H01L 25/0753* (2013.01); *H01L 33/54* (2013.01); *H01L 33/56* (2013.01); *H01L 33/62* (2013.01); *H05K 1/115* (2013.01); *H05K 1/186* (2013.01); *H05K 3/10* (2013.01); *H05K 3/284* (2013.01); *H05K 3/30* (2013.01); *H01L 2933/005* (2013.01); *H01L 2933/0066* (2013.01); *H05K 2201/10106* (2013.01); *H05K 2203/1316* (2013.01); *H05K 2203/1327* (2013.01)

(58) Field of Classification Search
CPC ......... H01L 33/54; H01L 33/56; H01L 33/62; H01L 25/0753; H05K 1/115; H05K 1/186; H05K 3/10; H05K 3/284; H05K 3/30
See application file for complete search history.

(56) References Cited

U.S. PATENT DOCUMENTS

| | | | |
|---|---|---|---|
| 5,355,577 | A | 10/1994 | Cohn |
| 5,460,638 | A | 10/1995 | Lock et al. |
| 5,545,291 | A | 8/1996 | Smith et al. |
| 5,696,389 | A | 12/1997 | Ishikawa et al. |
| 5,904,545 | A | 5/1999 | Smith et al. |
| 6,527,964 | B1 | 3/2003 | Smith et al. |
| 6,566,744 | B2 | 5/2003 | Gengel |
| 6,623,579 | B1 | 9/2003 | Smith et al. |

(Continued)

FOREIGN PATENT DOCUMENTS

| | | |
|---|---|---|
| JP | 2006-278511 | 10/2006 |
| JP | 11-186590 | 7/2007 |
| JP | 2007-294566 | 11/2007 |

OTHER PUBLICATIONS

Morris et al "Self-assembly for microscale and nanoscale packaging: steps toward self-packaging", IEEE Trans. Adv. Packag., 2005, 28, 600-611.

(Continued)

*Primary Examiner* — Karen Kusumakar
(74) *Attorney, Agent, or Firm* — Hamilton, DeSanctis & Cha

(57) ABSTRACT

Embodiments are related to fluidic assembly and, more particularly, to systems and methods for forming physical structures on a substrate.

42 Claims, 6 Drawing Sheets

(56) References Cited

U.S. PATENT DOCUMENTS

| | | |
|---|---|---|
| 6,771,019 B1 | 8/2004 | Wu et al. |
| 6,821,805 B1 | 11/2004 | Nakamura et al. |
| 6,927,382 B2 | 8/2005 | King et al. |
| 7,528,422 B2 | 5/2009 | Murphy |
| 7,589,355 B2 | 9/2009 | Tomoda et al. |
| 7,687,277 B2 | 3/2010 | Sharma et al. |
| 7,727,788 B2 | 6/2010 | Han et al. |
| 7,727,804 B2 | 6/2010 | Smith |
| 7,874,474 B2 | 1/2011 | Kim et al. |
| 7,928,655 B2 | 4/2011 | Lin et al. |
| 7,931,063 B2 | 4/2011 | Craig et al. |
| 8,076,178 B2 | 12/2011 | Krishnamoorthy et al. |
| 8,318,595 B2 | 11/2012 | Morris et al. |
| 8,426,227 B1 | 4/2013 | Bibi et al. |
| 8,516,683 B2 | 8/2013 | Credelle et al. |
| 8,552,436 B2 | 10/2013 | Bibi et al. |
| 8,629,465 B2 | 1/2014 | Yu et al. |
| 8,648,328 B2 | 2/2014 | Crowder et al. |
| 8,685,774 B2 | 4/2014 | Crowder et al. |
| 8,713,972 B2 | 5/2014 | Lakota et al. |
| 9,003,835 B2 | 4/2015 | Lock et al. |
| 2001/0010566 A1* | 8/2001 | Izumi ............... G02F 1/13439 349/43 |
| 2003/0057444 A1 | 3/2003 | Niki et al. |
| 2007/0031992 A1 | 2/2007 | Schatz |
| 2007/0120463 A1 | 5/2007 | Hayashi et al. |
| 2007/0224713 A1 | 9/2007 | Han et al. |
| 2008/0036038 A1 | 2/2008 | Hersee |
| 2010/0163895 A1 | 7/2010 | Horie |
| 2010/0276664 A1 | 11/2010 | Hersee |
| 2011/0031516 A1 | 2/2011 | Basin et al. |
| 2013/0011617 A1* | 1/2013 | Tasaki ................ B29C 45/14 428/148 |
| 2013/0161584 A1 | 6/2013 | Crowder et al. |
| 2013/0161643 A1 | 6/2013 | Crowder et al. |
| 2014/0008696 A1 | 1/2014 | Kim et al. |
| 2014/0077158 A1 | 3/2014 | Crowder et al. |
| 2014/0355931 A1 | 12/2014 | Tummala et al. |
| 2015/0049498 A1 | 2/2015 | Zhou et al. |
| 2015/0060402 A1 | 3/2015 | Burkett et al. |
| 2015/0140721 A1 | 5/2015 | Moslehi et al. |
| 2015/0155445 A1 | 6/2015 | Zhan et al. |
| 2015/0166396 A1 | 6/2015 | Marjanovic et al. |
| 2015/0210074 A1 | 7/2015 | Chen et al. |
| 2015/0214430 A1 | 7/2015 | Zhan et al. |

OTHER PUBLICATIONS

Boncheva "Millimeter-scale self-assembly and its applications", Pure Appl. Chem., 75, No. 5, pp. 621-630, 2003.

Mastrangeli et al "Self-assembly from milli- to nanoscales: methods and applications" J. Micromech. Microeng., 2009,19, 083001, (37 pp).

Yeh "Fluidic self-assembly for the integration of GaAs light-emitting diodes on Si substrates", IEEE Photonics Technol. Lett., 1994, 6, 706-708.

Tien "Microfabrication through electrostatic self-assembly", Langmuir, 1997, 13, 5349-5355.

Snyder et al "Fluidic self-assembly of semiconductor devices: a promising new method of mass-producing flexible circuitry", Jpn. J. Appl. Phys., 2002,41,4366-4369.

Chung,Programmable reconfigurable self-assembly: parallel heterogeneous integration of chip-scale components on planar and nonplanar surfaces, J. Microelectromech. Syst., 2006.

Stauth "Self-assembled single-crystal silicon circuits on plastic", Proc. Natl. Acad. Sci. U. S. A., 2006, 103, 13922-13927.

Saeedi et al "Self-assembled single-digit micro-display on plastic", Proc. of SPIE, 2008, 6885, 688509.

Park "Orientation-specific self-assembly at air-water interface using magnetic field", Transducers'11, Beijing, China, Jun. 5-9, 2011, 866-869.

Tkachenko "Evaluation of directed self-assembly process for LED assembly on flexible substrates", Electronic Components & Technology Conference (ECTC), 2013 IEEE 63rd.

Nakagavva "Controlled deposition of silicon nanowires on chemically patterned substrate by capillary force using a blade-coating method", J. Phys. Chem. C, 2008,112, 5390-5396.

Arase, "Interfacial-energy-controlled deposition technique of microstructures using blade-coating", J. Phys. Chem. B, 2009, 113, 15278-15283.

Nakagawa "Interfacial-force-controlled placing technique of microstructures of sub- to one hundred micrometer size using blade coating", Jpn. J, Appl, Phys., 2011, 50, 01BJ09.

Arase, "Fluidic self-assembly of microstructures using a blade-coating technique" Jpn J. Appl. Phys., 2012, 51, 036501.

Nordquist et al., "An Electro-Fluidic Assembly Technique for Integration of III-V Devices onto Silicon" IEEE International Symposium on Compound Semiconductors, Proc. 2000.

Khare et al "Via Hole Formation in Semi-Insulating InP Using Wet Photoelectrochemical Etching" Indium Phosphide and Related Materials, 1993. Conference proceedings.

Brusberg et al, "Thin Glass Based Packaging Technologies for Optoelectronic Modules" Electronic Components and Technology Conference, 2009.

Kim et al Large Scale Self-assembly of crystalline semiconductor microsomponents onto plastic substrates via microfluidic traps 4th IEEE Conf. on Automation (2008).

Xiao et al "Fluidic assisted thin-film device heterogeneous integration: surface tension as driving force and magnetic as guiding force" Science Direct (2015).

Yeh et al, "New fabrication technique for the integration of large area optoelectronic display panels" OSA/CLEO (1994).

Varna et al "Fluidic self-assembly of silicon microstructures" University of CA Berkley (1995).

Talghader Integration of LEDs and VCSELs using fluidic self-assembly (SPIE vol. 3286, p. 86).

Zheng et al, "Self-assembly process to integrate and connect semiconductor dies on surfaces with single-angular orientation and contact pad registration" Adv. Mater. (2006,18).

Park et al "A First Implementation of an Automated Reel-to-Reel Fluidic Self-Assembly Machine" Adv. Mater. vol. 26, No. 34, 9/14 Available online Jun. 2014.

Park et al "Printed Assemblies of Inorganic Light-Emitting Diodes for Deformable and Semitransparent Displays" Aug. 2009 www.Sciencemag.org.

Jacobs et al "Fabrication of a Cylindrical Display by Patterned Assembly" Science, vol. 296, Apr. 2002.

Chung et al "Guided and Fluidic Self-Assembly or Microstructures Using Railed Microfluidic channels" Pub. online Jun. 15, 2008.

* cited by examiner

SYSTEMS AND METHODS FOR CREATING FLUIDIC ASSEMBLY STRUCTURES ON A SUBSTRATE

FIELD OF THE INVENTION

Embodiments are related to fluidic assembly and, more particularly, to systems and methods for forming physical structures on a substrate.

BACKGROUND

LED displays, LED display components, and arrayed LED devices include a large number of diodes placed at defined locations across the surface of the display or device. Fluidic assembly may be used for assembling diodes in relation to a substrate. Such assembly is often a stochastic process whereby LED devices are deposited into wells on a substrate. Forming such wells into the surface of a substrate using traditional pattern and etch processes can result in irregular well shapes including, for example, concave down well bottoms that make fluidic assembly less controllable.

Hence, for at least the aforementioned reasons, there exists a need in the art for advanced systems and methods for manufacturing physical structures on a substrate.

SUMMARY

Embodiments are related to fluidic assembly and, more particularly, to systems and methods for forming physical structures on a substrate.

This summary provides only a general outline of some embodiments of the invention. The phrases "in one embodiment," "according to one embodiment," "in various embodiments", "in one or more embodiments", "in particular embodiments" and the like generally mean the particular feature, structure, or characteristic following the phrase is included in at least one embodiment of the present invention, and may be included in more than one embodiment of the present invention. Importantly, such phrases do not necessarily refer to the same embodiment. Many other embodiments of the invention will become more fully apparent from the following detailed description, the appended claims and the accompanying drawings.

BRIEF DESCRIPTION OF THE FIGURES

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF SOME EMBODIMENTS

Embodiments are related to fluidic assembly and, more particularly, to systems and methods for forming physical structures on a substrate.

Various embodiments provide assembly panels that include: a substrate having a top surface; an electronics structure layer disposed over the top layer of the substrate; and a sol-gel based structural layer disposed over the top layer of the substrate and the electronics structure layer. The sol-gel based structural layer includes openings exposing at least a part of the electronics structure layer. In some instances of the aforementioned embodiments, the electronics structure layer exhibits a first thickness and the sol-gel based structural layer exhibits a second thickness that is at least three times thicker than the first thickness. In more particular instances, the second thickness is at least five times thicker than the first thickness.

Figure 7:
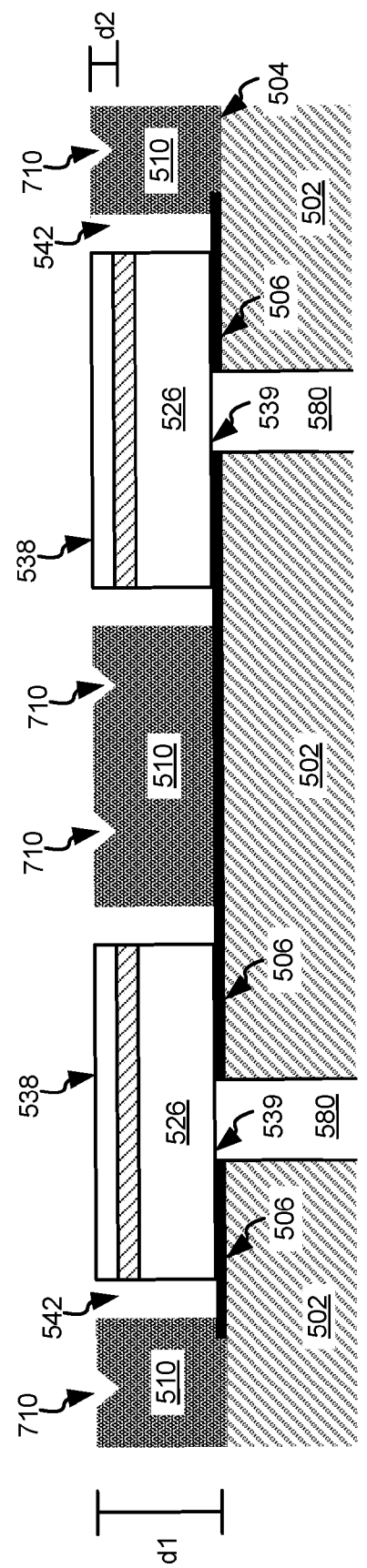
FIG. 7 depicts a micro device assembly in accordance with some embodiments of the present invention showing multiple well features and including texture features, and corresponding to the processing state shown in FIG. 5c.

In various instances of the aforementioned embodiments, the sol-gel structural layer is formed of two or more of a silane, a silicate, and water. In some instances of the aforementioned embodiments, the sol-gel structural layer is formed of at least two of: hydroxy(polydimethylsiloxane), methyltriethoxysilane, phenyltriethoxysilane, tetraethylorthosilicate, water, and octyltrichlorosilane. In one or more instances of the aforementioned embodiments, the electronics structure layer includes an electrically conductive material 506 connecting a bottom area of a first of the openings (e.g., left well 542 of FIG. 7) to a bottom area of a second of the openings (e.g., right well 542 of FIG. 7). In various instances of the aforementioned embodiments, a material of the substrate may be one of polymer, metal, ceramic, glass, and glass-ceramic. In particular cases, the substrate is a multi-layer structure. In some cases, vias extend through the substrate from the bottom of a subset of the openings.

Other embodiments provide methods for manufacturing a device that include: providing a substrate; and forming a sol-gel based structural layer over the substrate using a solution-based process, where the sol-gel structural layer includes varying feature depths. In some instances, the solution-based process includes a subtractive process, and in various cases the solution-based process includes an additive process.

In various cases, the varying feature depth includes openings in the sol-gel based structural layer through which an underlying layer is exposed. In some cases, the methods further include forming an electronics structure layer over the substrate prior to forming the sol-gel based structural layer over the substrate such that the sol-gel based structural layer covers at least a portion of the electronics structure layer. In such cases, the underlying layer may be, but is not limited to, the electronics structure layer, and the top surface of the substrate. In various cases, the methods further include: using fluidic assembly to deposit micro-devices in the openings; and forming an encapsulation layer over the sol-gel based structural layer and the micro-devices. It should be noted that the term "encapsulation" is used in its broadest sense to mean covering. Thus, encapsulation may include hermetic sealing, but also includes other covering that does not result in a hermetic seal. In particular cases, the micro-devices are light emitting diodes. In one or more cases, forming the encapsulation layer includes depositing a sol-gel material over the substrate, and curing the sol-gel material.

In one or more instances, the solution-based process includes an additive process that may be, but is not limited to, a replication process, a stamping process, and a printing process. In various instances of the aforementioned embodiments, the solution-based process is an additive, printing process. Such a printing process may be, but is not limited to, screen printing, flexo printing, gravure printing, inkjet printing, and offset printing. In various instances, the solution-based process is an additive process that includes curing a sol-gel material added over the substrate.

The sol-gel layer can be patterned by additive processes, subtractive processes, or a combination of additive and subtractive processes. In some cases, vias extend through the substrate from the bottom of a subset of the openings. The sol-gel layer can have features (example shown in FIG. 7, elements 542, 710) with multiple vertical dimensions (example shown in FIG. 7, elements d1, d2). For example, well structures 542 can be formed in the sol-gel layer 510 with vertical depths d1 of greater than or equal to one micron ($\geq 1$ um) in addition to sol-gel surface texture features 710 with depths d2 of less than one micron (<1 um). Additionally, pre-defined features can be fabricated in the sol-gel layer with resolutions of less than ten microns (<10 um). For example, for features with vertical depths of greater than or equal to fifty nanometers ($\geq 50$ nm), horizontal feature dimensions in some cases may be less than or equal to ten microns ($\leq 10$ um). In other cases, the horizontal feature dimensions may be less than or equal to five microns ($\leq 5$ um). In yet other cases, the horizontal feature dimensions may be less than or equal to three microns ($\leq 3$ um). In yet further cases, the horizontal feature dimensions may be less than or equal to one micron ($\leq 1$ um).

Yet other embodiments provide electronic display devices. The electronic display devices include: a substrate, an electronics structure layer, a sol-gel based structural layer, light emitting diodes, and an encapsulation layer. The electronics structure layer is formed over the substrate and includes a first electrically conductive trace. The sol-gel based structural layer is formed over the substrate such that the sol-gel based structural layer covers a first portion of the electronics structure layer. The sol-gel structural layer includes openings though which a second portion of the electronics structure layer is exposed, and the first electrically conductive trace electrically connects the bottom of at least two of the openings. The light emitting diodes are each within a respective one of the openings, and each of the light emitting diodes includes an upper electrical contact and a lower electrical contact. The lower electrical contact of a subset of the light emitting diodes is electrically connected to the first electrically conductive trace. The encapsulation layer covers at least a portion of the sol-gel based structural layer and micro-devices filing portions of the openings not already filled by the light emitting diodes. A second electrically conductive trace electrically connects the upper electrical contacts of two or more of the light emitting diodes.

Further embodiments provide assembly panels that include a substrate having a top surface. A sol-gel based structural layer is disposed adjacent to the top surface of the substrate, and an electronics structure layer is disposed over the sol-gel based structural layer such that the electronics structure layer is separated from the substrate by the sol-gel structural layer. In some such instances, no electronics exist between the sol-based structural layer and the top surface of the substrate.

Yet additional embodiments provide assembly panels that include: a substrate; and a solution-based structural layer disposed over the substrate. The solution-based structural layer exhibits a thermal excursion capability of greater than three hundred degrees Celsius, an optical transmission of greater than eighty percent, a thickness of greater than two micrometers, and a Youngs modulus of greater than 20 GPa. In more particular instances, the thermal excursion capability is greater than three hundred, fifty degrees Celsius, the optical transmission is greater than ninety percent, the thickness of greater than three micrometers, and the Youngs modulus is greater than 30 GPa. In some cases, the solution-based structural layer is made of a sol-gel material. In some cases, the sol-gel material exhibits a feature resolution of less than ten micrometers for features having a depth of greater than fifty nanometers.

Figure 1A:
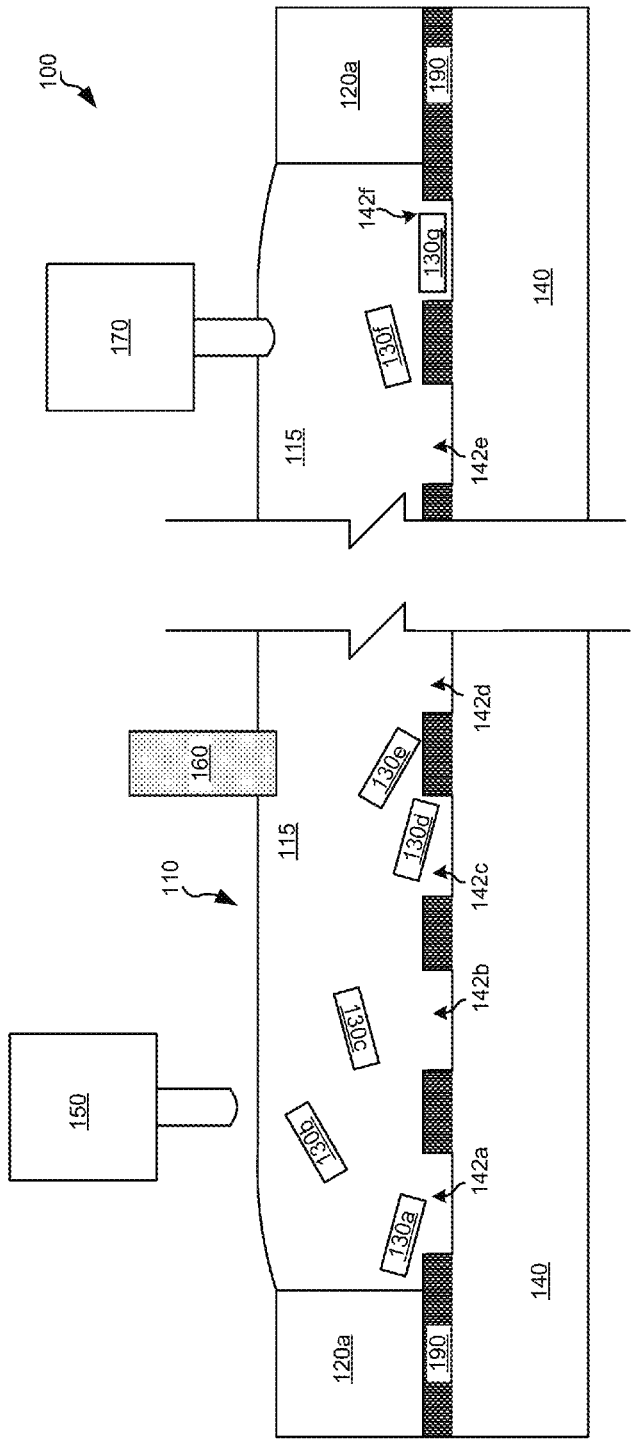
FIGS. 1a-1b depicts a fluidic assembly system capable of moving a suspension composed of a carrier liquid and a plurality of physical objects relative to a sol-gel based structural alignment layer atop a surface of a substrate in accordance with one or more embodiments of the present inventions.
Figure 1B:
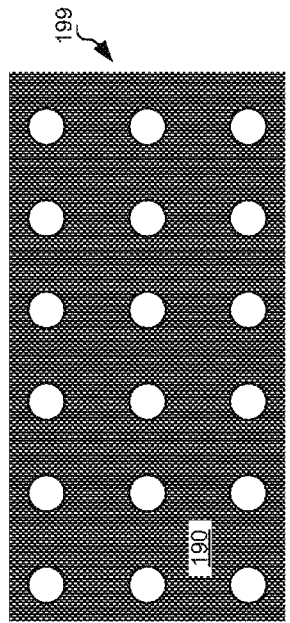

Turning to FIG. 1a, a fluidic assembly system 100 is shown that is capable of moving a suspension 110 composed of a carrier liquid 115 and a plurality of physical objects 130 relative to a sol-gel based structural alignment layer 190 atop a surface of a substrate 140 in accordance with one or more embodiments of the present inventions. In some cases, physical objects 130 may be micro-diodes, however, in other cases the physical objects may be other electronic devices or non-electronic devices. Turning to FIG. 1b, an example top view of the surface of substrate 140 is shown with an array of wells (shown as circles) extending into sol-gel based structural alignment layer 190. It should be noted that while wells 142 are shown as circular in cross-section that other shapes may be used in relation to different embodiments. In some embodiments, substrate 140 is a glass substrate and wells 142 are sixty (60) micrometers in diameter formed in sol-gel based structural alignment layer 190 at five hundred (500) micrometers offsets. In some embodiments sol-gel based structural alignment layer 190 is formed over substrate 140 using an additive process such as, for example, patterning, printing, replication, or stamping of a sol-gel material with sufficient transparency. In other embodiments sol-gel based structural alignment layer 190 is formed over substrate 140 using a subtractive process such as, for example, patterning and etching. In other embodiments, the sol-gel layer is patterned using a combination of additive and subtractive processes. Sol-gel structures can also be formed in combination with physical patterns in other layers or the substrate.

In some cases, the thickness of sol-gel based structural alignment layer 190 is substantially equal to the height of physical objects 130. In some cases, the thickness of sol-gel based structural alignment layer 190 is the same as the depth of wells 142. An inlet opening of wells 142 is greater that the width of physical objects 130 such that only one physical object 130 deposits into any given well 142. It should be noted that while embodiments discuss depositing physical objects 130 into wells 142, that other devices or objects may be deposited in accordance with different embodiments of the present inventions.

A depositing device 150 deposits suspension 110 over the surface of substrate 140 with suspension 110 held on top of substrate 140 by sides 120 of a dam structure. In some embodiments, depositing device 150 is a pump with access to a reservoir of suspension 110. A suspension movement device 160 agitates suspension 110 deposited on substrate 140 such that physical objects 130 move relative to the surface of substrate 140. As physical objects 130 move relative to the surface of substrate 140 they deposit into wells 142. In some embodiments, suspension movement device 160 is a brush that moves in three dimensions. Based upon the disclosure provided herein, one of ordinary skill in the art will recognize a variety of devices that may be used to perform the function of suspension movement device 160 including, but not limited to, a pump.

A capture device 170 includes an inlet extending into suspension 110 and capable of recovering a portion of suspension 110 including a portion of carrier liquid 115 and non-deposited physical objects 130, and returning the recovered material for reuse. In some embodiments, capture device 170 is a pump. In some cases, substrate 140 including sol-gel based structural alignment layer 190 is formed using one or more of the processes discussed below in relation to FIGS. 3-6. In various embodiments, once physical objects 130 are in place in respective wells 142, physical objects 130 are encapsulated using a sol-gel based process. Such an encapsulation may use the same sol-gel process used to form sol-gel based structural alignment layer 190, or may be use a different sol-gel process such as, for example, using a doctor blade, slot-die coating, or printing process to apply a thin coating of sol-gel over the assembled product. After this, top electrical contacts may be formed to electrically connect physical objects 130. An example of such a completed product including assembled physical objects 130, encapsulation and electrical connection is discussed below in relation to FIG. 2. Structures in the sol-gel layer can be formed in combination with other structural elements. These can include physical structures in the substrate, layers that exist between the substrate and the sol-gel, and layers above the sol-gel. These structures in multiple layers can be combined to form composite well, via, fluidic flow channel or other elements. It should be noted that vias may be formed in substrate 140. These vias may extend from the bottom of each well 142 through substrate 140, or exist outside of the wells 142.

It has been determined that use of sol-gel material to form structural alignment layers for capturing micro devices during fluidic assembly is superior to organic coating as it allows for improved hermeticity, higher temperature processing, greater optical transmission, desirable mechanical stability, compatibility with various solder processes, and a more chemically inert surface onto which fluidic assembly is performed. As an example, use of the sol-gel based structural material enables thermal processing with temperature excursions in some cases greater than two hundred degrees Celsius (>200 C) depending upon the particular sol-gel material and a desired optical transmission (e.g., ≥70%, ≥80%, or ≥90 in a wavelength range of 400-800 nm). In other cases, temperature excursions greater than three hundred degrees Celsius (>300 C) are possible depending upon the particular sol-gel material and a desired optical transmission (e.g., ≥70%, ≥80%, or ≥90 in a wavelength range of 400-800 nm). In yet other cases, temperature excursions greater than three hundred, fifty degrees Celsius (>350 C) are possible depending upon the particular sol-gel material and a desired optical transmission (e.g., ≥70%, ≥80%, or ≥90 in a wavelength range of 400-800 nm). In particular cases, temperature excursions greater than four hundred degrees Celsius (>400 C) are possible depending upon the particular sol-gel material and a desired optical transmission (e.g., ≥70%, ≥80%, or ≥90 in a wavelength range of 400-800 nm). The aforementioned temperature excursions and characteristics can be achieved while forming structural alignment layer 190 with relatively large thicknesses (e.g., from one micron (≥1 um) to more than ten microns (10 um) in thickness. Further, such use of sol-gel materials offer easier tuning of viscosity to facility processing without significantly altering the final film properties when compared with organic coating, and/or greater tuning ability of optical and electrical properties of sol-gel process to form sol-gel based structural alignment layer 190. Additionally, or alternatively, use of a sol-gel process to form sol-gel based structural alignment layer 190 allows for printing to a known thickness in a single step while a traditional pattern and etch of an organic coating to a consistent bath requires constant maintenance of an etch bath. It should be noted that the aforementioned are just example advantages that may be achieved, and that based upon the disclosure provided herein, one of ordinary skill in the art will recognize additional or alternative advantages that may be achievable in accordance with different embodiments.

Figure 2:
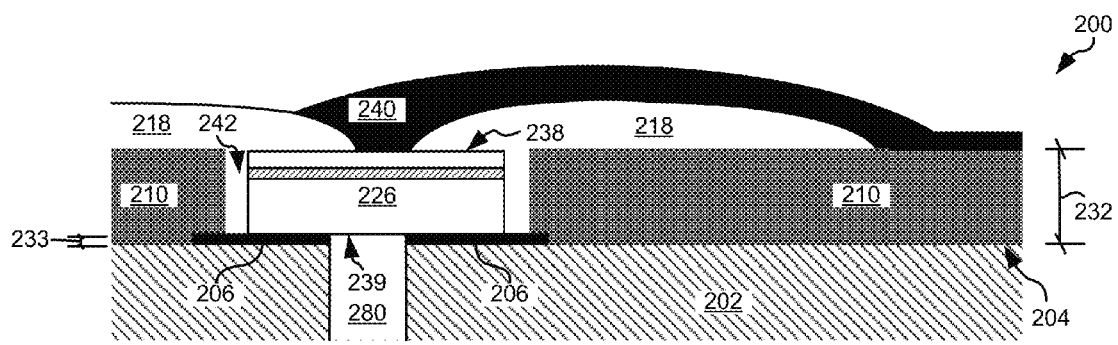
FIG. 2 shows a completed micro-device assembly including a well defined in a sol-gel based structural alignment layer in accordance with various embodiments of the present inventions.

Turning to FIG. 2, a completed micro-device assembly 200 is shown that includes a well 242 defined in a sol-gel based structural alignment layer 210 in accordance with various embodiments of the present inventions. Micro-device assembly 200 may be part of a larger assembly panel including a large number of micro-device assemblies. Sol-gel based structural alignment layer 210 is disposed over a substrate 202 that includes a via 280 extending from the bottom of well 242. It should be noted that the vias are not included in other embodiments. Substrate 202 may be formed of any material and material thickness that is compatible with the deposition and curing of sol-gel based structural alignment layer 210. As just some examples, substrate 202 may be glass, glass-ceramic, ceramic, polymer, and/or metal. Substrate 202 may be a single material, a stack of layers, and/or a composite material. In one particular embodiment where micro-device assembly 200 is used in relation to transparent display applications, substrate 202 may be a glass substrate less than seven hundred (700) micrometers in thickness. In particular embodiments, substrate 202 may have a total thickness of less than 0.1 millimeters (≤0.1 mm) to about 0.7 millimeters (≤0.7 mm). Substrate 202 may be in the form of, but is not limited to, individual free-standing sheets/wafers, flexible substrates bonded to a carrier, or flexible substrate web suitable for roll to roll processing.

A bottom contact 206 is formed over substrate 202 at locations where an electrical contact is to be made. Bottom contact 206 may be, for example, a metal layer with a thickness 233 of less than one (1) micrometer. This bottom contact 206 may be included as part of an electronics layer that may include a variety of electrical circuitry formed as part of a layer that exhibits a thickness (e.g., thickness 233) that is substantially smaller than a thickness 232 of sol-gel based structural alignment layer 210. In some cases, thickness 232 is at least twice that of thickness 233. In various cases, thickness 232 is at least three times that of thickness 233. In particular cases, thickness 232 is at least five times that of thickness 233. In various embodiments, sol-gel based structural alignment layer 210 may be ten (10) times to up to fifty (50) times the thickness of an electronic conductor line present in the final structure and existing either below sol-gel based structural alignment layer 210 (i.e., between sol-gel based structural alignment layer 210 and substrate 202) or above sol-gel based structural alignment layer 210, or a combination of both below and above sol-gel based structural alignment layer 210.

A micro-device 226 is deposited in well 242. This deposition may be accomplished, for example, by using a fluidic assembly process similar to that discussed above in relation to FIG. 1. In some cases, micro-device 226 is an electronic device having an electrically conductive bottom layer 239 and an electrically conductive top layer 238. In particular cases, micro-device 226 is a light emitting diode. An encapsulation layer 218 is formed over at least part of sol-gel based structural alignment layer 210 and micro-device 226 filling open areas of well 242. Encapsulation layer 218 secures micro-device 226 in place within well 242. In embodiments where micro-device assembly 200 is part of a display, encapsulation layer 218 is substantially transparent allowing light from micro-device 226 to transmit beyond encapsulation layer 218. In some cases, encapsulation layer 218 is formed of the same material used to form sol-gel based structural alignment layer 210. An electrical contact layer 240 is formed over substrate 202 such that contact is made with electrically conductive top layer 238 and other electrical contacts (not shown) on completed micro-device assembly 200. In addition, the final structure can include sol-gel elements on the substrate side opposite of the fluidically placed elements.

Figure 3:
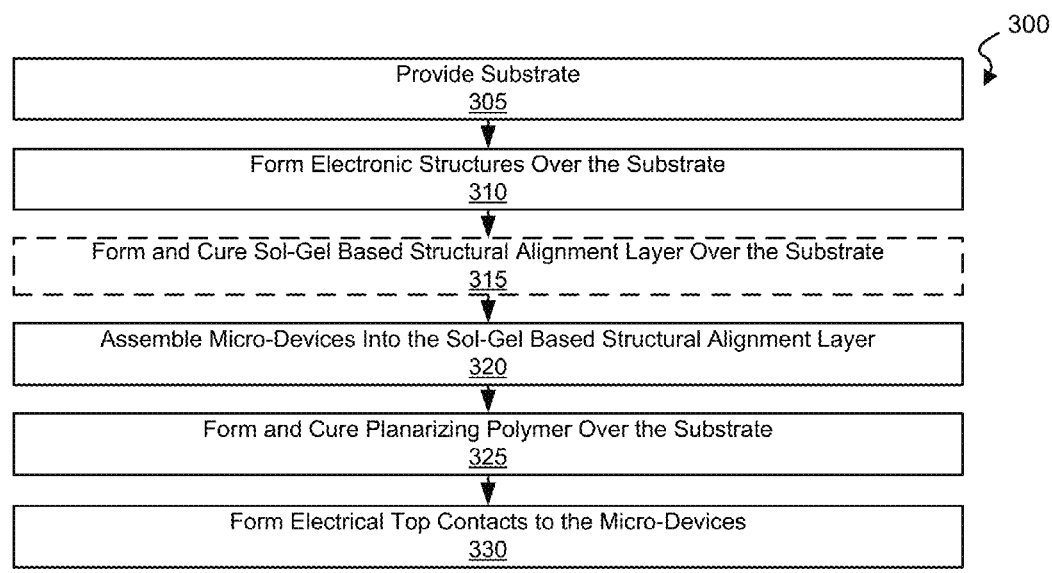
FIG. 3 is a flow diagram depicting a method in accordance with some embodiments of the present inventions for forming a micro-device assembly including wells defined in a sol-gel based structural alignment layer.

Turning to FIG. 3, a flow diagram 300 shows a method in accordance with some embodiments of the present inventions for forming a micro-device assembly including wells defined in a sol-gel based structural alignment layer. Following flow diagram 300, a substrate is provided (block 305). The substrate may be formed of any material and material thickness that is compatible with the deposition and curing of a sol-gel based structural alignment layer. In some cases, the substrate includes vias extending through the substrate. As just some examples, the substrate may be glass, glass-ceramic, ceramic, polymer, and/or metal. The substrate 202 may be a single material, a stack of layers, and/or a composite material. In one particular embodiment where the manufactured micro-device assembly is part of a display, the substrate may be a glass substrate seven hundred (700) micrometers or less in thickness. The substrate may be in the form of, but is not limited to, individual free-standing sheets/wafers, flexible substrates bonded to a carrier, or flexible substrate web suitable for roll to roll processing.

Figure 5A:
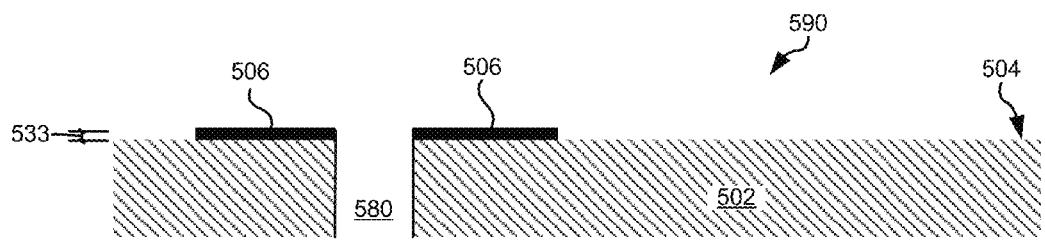
FIGS. 5a-5e show a subset of processing steps including sol-gel based structural alignment layer formation consistent with the method shown in FIG. 3.

Electronic structures are formed over the substrate (block 310). Such electronic structures may include, but are not limited to, electrically conductive traces and/or transistors. These electronic structures may be formed using any processing known in the art for forming electronic structures. Based upon the disclosure provided herein, one of ordinary skill in the art will recognize a variety of electronic structures and process for forming electronic structures that may be used in relation to different embodiments. Turning to FIG. 5a, an interim product 590 is shown that includes a substrate 502 through which a via 580 has been formed. Interim product 590 is shown after formation of electronic structures (in this cases electrical contacts 506) with a thickness 533 over a top surface 504 of substrate 502.

Figure 4A:
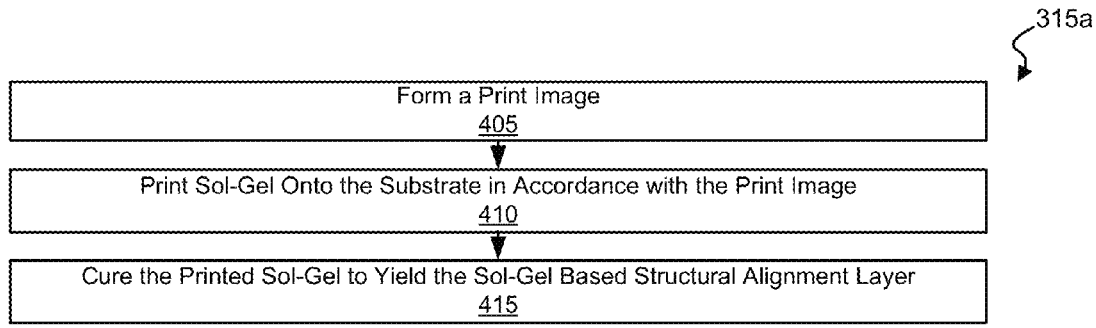
FIGS. 4a-4c are each flow diagrams showing different processes for creating sol-gel based structural alignment layers in accordance with different embodiments of the present inventions.
Figure 4B:
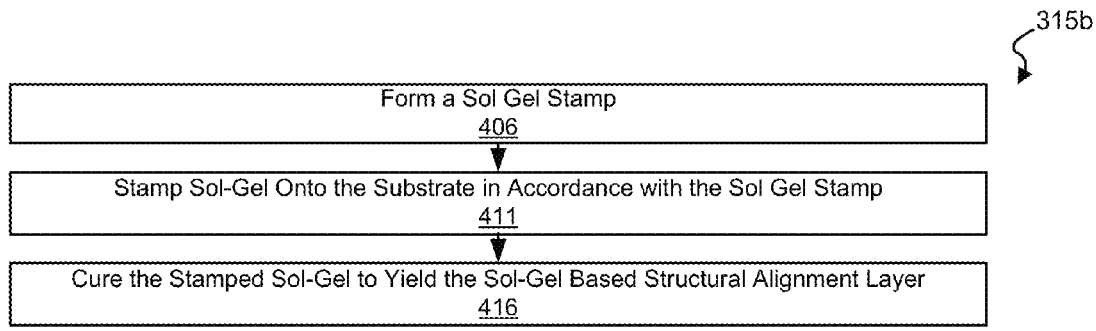
Figure 4C:
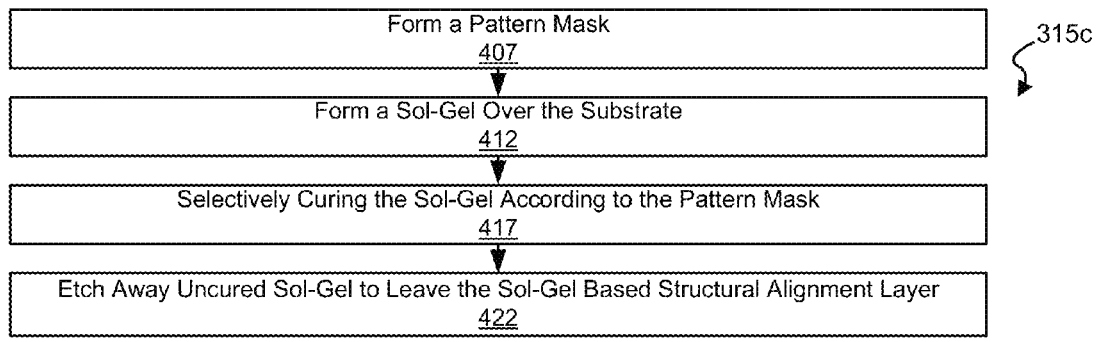
Figure 5B:
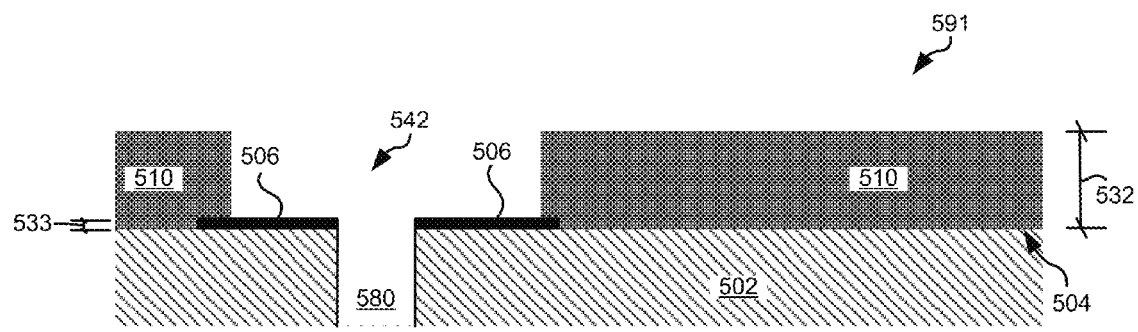

Retuning to FIG. 3, a sol-gel based structural alignment layer is formed and cured over the substrate (block 315). This process may be done in different ways depending upon the particular embodiment and is shown in dashed lines indicating that it may be replaced by one of the processes set forth in FIGS. 4a-4c. In addition, this sol-gel based structural alignment layer can be formed in combination with multiple or repeating methods. In particular, FIGS. 4a-4b show different additive approaches (i.e., a process where sol-gel is added and cured at locations where sol-gel structures are desired) for forming the sol-gel based structural alignment layer. In contrast, FIG. 4c shows a subtractive approach (i.e., a process where sol-gel is removed from locations where voids between sol-gel structures are desired) for forming the sol-gel based structural alignment layer. It is also possible to combine both additive and subtractive processes. In any of the cases, a sol-gel structural layer is formed. Turning to FIG. 5b, an interim product 591 is shown that includes a sol-gel structural layer 510 formed over substrate 502 with a void 542 formed between sol-gel structures.

Turning to FIG. 4a, a flow diagram 315a shows a print method for forming and curing a sol-gel based structural alignment layer in accordance with some embodiments. Following flow diagram 315a, a print image is formed (block 405). The print image is an image of the surface of the substrate where a sol-gel material is to be printed, and where the sol-gel material is not to be printed. The areas where the sol-gel is to be printed correspond to the sol-gel structures of the sol-gel based structural alignment layer, and the areas where the sol-gel is not to be printed corresponds to voids within the sol-gel based structural alignment layer. In some cases, the voids are the wells into which micro-devices may be deposited during fluidic assembly.

The sol-gel material is then printed onto the substrate over the previously formed electronic structures (block 410). In other examples, the sol-gel material is patterned adjacent to the substrate structure with no intermediate electronic structure existing between the sol-gel and the substrate. In some embodiments the printing process is a screen printing, flexo printing, gravure printing, ink jet printing, or offset printing process. In a gravure printing embodiment, the print image is engraved or photo-lithographically formed on the surface of an impression roller. A printing cylinder is coated with the sol-gel material, and the substrate is rolled between the impression roller and the printing cylinder resulting in the sol-gel material depositing at locations on the substrate where the structures of the sol-gel based structural alignment layer are to be formed as indicated by the print image on the impression roller.

In other embodiments, the printing process is an offset printing process. In such an embodiment, the print image is engraved or photo-lithographically formed on a printing plate. The printing plate is then coated with the sol-gel material, and then pressed against the substrate. Pressing the sol-gel coated printing plate against the substrate results in the sol-gel material depositing at locations on the substrate where the structures of the sol-gel based structural alignment layer are to be formed as indicated by the print image on the printing plate. In other embodiments, the printing process is a screen printing process. In such an embodiment, the print image is patterned onto a screen.

In yet other embodiments, the printing process is inkjet printing. In such an embodiment, fine droplets of the sol-gel material are propelled onto the substrate in accordance with the print image. In particular, droplets of the sol-gel material are propelled onto the substrate at locations where structures of the sol-gel based structural alignment layer are to be formed.

Regardless of the type of printing used, the printing process results in formation of the sol-gel material in areas where the sol-gel structures of the sol-gel based structural alignment layer are indicated by the print image. The sol-gel material may consist of, but is not limited to, a mixture of triethoxy-, trichloro-, and/or trifluoro-, silanes, tetraethylorthosilicate (TEOS), and water (for hydrolysis of silanes). The silanes are further functionalized with organic moieties such that the moiety may be reactive for cross linking reactions, an alkyl chain or fluorinated species for surface energy modification, a reactive species such as —SH or —CN for metal adhesion. As one particular example, the sol-gel material may be formed of relative volumes of ingredients shown in Table A below:

TABLE A

| Ingredient | Volume (milliliter) |
| --- | --- |
| hydroxy (polydimethylsiloxane) | 0.25 |
| methyltriethoxysilane | 3.5 |
| phenyltriethoxysilane | 3.5 |
| tetraethylorthosilicate (TEOS) | 1.25 |
| water | 0.75 |
| octyltrichlorosilane | 0.5 |

The aforementioned sol-gel is designed to be deposited by spin cast and to meet required optical transmission, thermal and chemical stability requirements for a specific fluidic assembly process. Based upon the disclosure provided herein, one of ordinary skill in the art will recognize other sol-gel formulations tuned for specific application requirements.

With the sol-gel material formed at the locations where structures of the sol-gel based structural alignment layer are to be formed (block 410), the substrate, previously formed electronic structures, and printed sol-gel material are exposed to a curing process (block 415). This curing process is designed to change the chemical structure of the sol-gel material to a mechanically stable solid. In some embodiments, the curing process includes exposing the sol-gel material over the surface of the substrate to ultraviolet radiation where a UV curable sol-gel material is used. In other embodiments, the curing process includes exposing the sol-gel material over the surface of the substrate to heat where a thermally condensable sol-gel material is used. In other embodiments, both UV and thermal exposure are used. In general, the energy used to cure the sol-gel can be optical, thermal, or from other sources.

Figure 6:
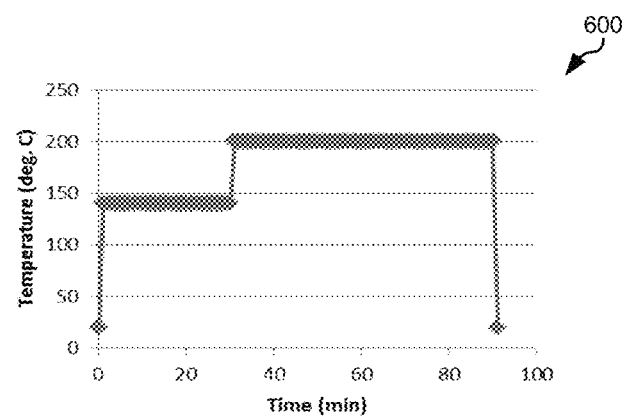
FIG. 6 depicts an example temperature based curing process that may be used in relation to different embodiments of the present inventions.

In some embodiments, the curing of the sol-gel can occur steps that include at least one (1) pre-cure cycle followed at a later time by a final cure step. If thermally curable sol-gel is used, the cure can occur at a reduced temperature (e.g., less than or equal to two hundred (200) degrees Celsius) that is compatible with subsequent device fabrication steps at elevated temperatures (e.g., greater than or equal to three hundred (300) degrees Celsius). For example, after curing at a relatively low temperature, the sol-gel remains mechanically stable during later device processing steps at a higher temperature of, for example, four hundred (400) degrees Celsius. As just some advantages, the sol-gel structural layers may be formed with relatively large thicknesses compared to that of the electronic structures without exhibiting micro-cracks after curing. In some embodiments, the thickness of the sol-gel based structural alignment layer is greater than one (1) micrometer. In various embodiments, the thickness of the sol-gel based structural alignment layer is greater than three (3) micrometers. In various embodiments, the thickness of the sol-gel based structural alignment layer is greater than five (5) micrometers. In particular embodiments, the thickness of the sol-gel based structural alignment layer is greater than ten (10) micrometers. Turning to FIG. 6, a graph 600 shows an example heat based curing process where the substrate and overlaying sol-gel material is cured at one hundred, fifty (150) degrees Celsius for thirty (30) minutes followed by curing at two hundred (200) degrees Celsius for sixty (60) minutes. It should be noted that that graph 600 shows one example curing process specific to a particular sol-gel material, and that other curing processes may be used in relation to different embodiments Turning to FIG. 4b, a flow diagram 315b shows a replication or stamping method for forming and curing a sol-gel based structural alignment layer in accordance with some embodiments. Following flow diagram 315b, a sol-gel stamp is formed (block 406). The stamp is engraved or photo-lithographically manufactured to include locations where sol-gel is to be formed on the surface of a substrate. The stamp is coated with the sol-gel material, and stamped against the surface of the substrate such that the sol-gel material on the stamp transfers to the surface of the substrate over the previously formed electronic structures (block 411). Alternatively, the substrate can be coated with the sol-gel material and the stamp then replicates a three dimensional pattern into its surface. This stamping process results in formation of the sol-gel material in areas where the sol-gel structures of the sol-gel based structural alignment layer are indicated by the print image. The sol-gel material may be similar to that discussed above in relation to FIG. 4a. With the sol-gel material formed at the locations where structures of the sol-gel based structural alignment layer are to be formed (block 411), the substrate, previously formed electronic structures, and printed sol-gel material are exposed to a curing process (block 416). This curing process may be similar to that discussed above in relation to FIG. 4a.

Turning to FIG. 4c, a flow diagram 315c shows a pattern and etch method for forming and curing a sol-gel based structural alignment layer in accordance with some embodiments. Following flow diagram 315c, a pattern mask is formed (block 407). The pattern mask is substantially transparent at locations where the sol-gel structures of the sol-gel based structural alignment layer are to be formed, and is substantially opaque at locations where voids between the sol-gel structures are desired. A sol-gel is formed over the substrate and any electronic structures previously formed on the substrate (block 412). The sol-gel may be formed over the substrate using any method known in the art including, but not limited to, solution-based deposition methods such as those using a doctor blade, vapor deposition, slot-die coating, spin coating, spray coating, or other methods. Based upon the disclosure provided herein, one of ordinary skill in the art will recognize a variety of processes that may be used for forming a sol-gel material on a substrate that may be used in relation to different embodiments. The sol-gel material may be similar to that discussed above in relation to FIG. 4a except that it must be a photo-definable material or compatible with a selective etch process. The sol-gel deposited over the substrate is selectively cured according to the pattern mask (block 417). This selective curing may be done by, for example, exposing the sol-gel material over the substrate to ultra-violet radiation through the pattern mask. This sol-gel material exposed to the ultra-violet radiation (i.e., the sol-gel material corresponding to substantially transparent areas of the pattern mask) is chemically changed to be more mechanically stable, and the sol-gel material not exposed to the ultra-violet radiation (i.e., the sol-gel material corresponding to substantially opaque areas of the pattern mask) remain mostly unchanged. The sol-gel material is then exposed to a chemical etch where uncured portions of the sol-gel material is etched away leaving only the cured portion of the sol-gel material (block 422). As the cured portion of the sol-gel layer corresponds to the sol-gel based alignment layer, the etch process results in formation of the sol-gel based alignment layer. Alternatively, the fully cured sol-gel can be patterned with typical photolithography and etching processes using photoresist and dry or wet etchants. In this case the sol-gel layer if formed and UV and/or thermally cured. A photoresist or other etch mask layer is patterned on its surface. The etch mask pattern is then transferred into the sol-gel layer by a wet or dry etch process. These subtractive etch processes of patterning the sol-gel layer can also be combined with previously described additive processes. For example, the sol-gel layer can be first patterned with a printing, stamping, replication, or molding step and then have its surface or structure modified by a subtractive etch process. In this way, use of subtractive, additive, or a combination of subtractive and additive processes can be used to create three dimensional features in the sol-gel layer with multiple levels of cross-sectional shapes. These cross-sectional shapes can include rounded bottoms, undercut sidewalls, flat bottom, linearly sloped sidewalls, or sidewalls with curved or arbitrary shapes.

Figure 5C:
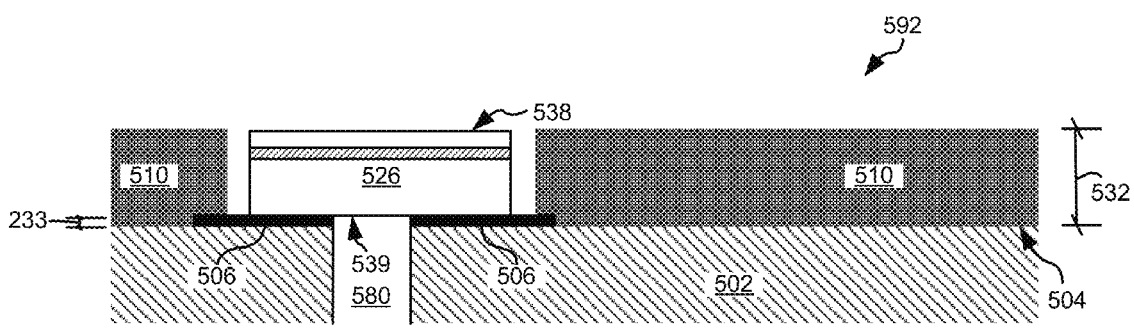

Returning to FIG. 3, micro-devices are assembled into the sol-gel based structural alignment layer (block 320). This may be done, for example, by forming a suspension of a carrier fluid an a number of micro-devices, and moving the suspension over the sol-gel based structural alignment layer such that micro-devices from the suspension deposit in voids between the structures of the structural alignment layer. Turning to FIG. 5c, an interim product 592 is shown that includes a micro-device 526 with a top surface 538 and a bottom surface 539 deposited within a void formed between sol-gel structures.

Figure 5D:
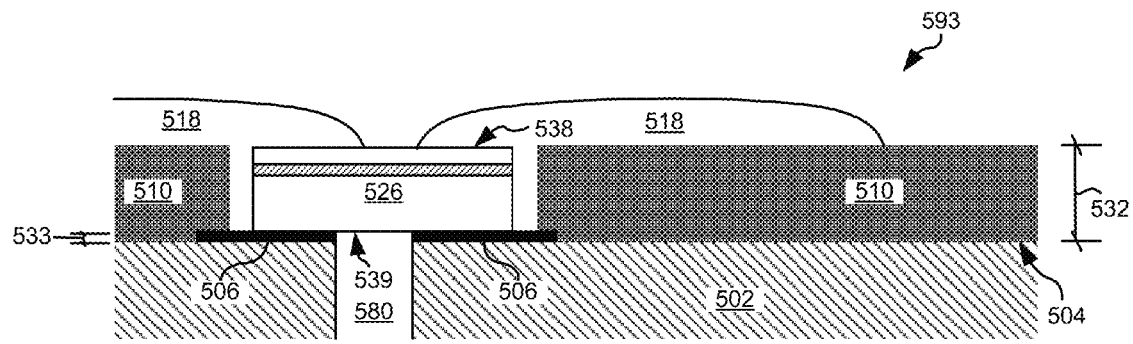
Figure 5E:
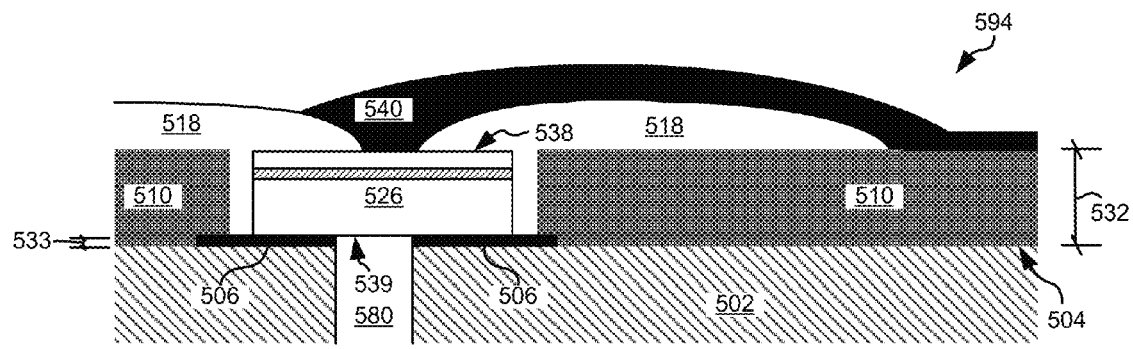

Returning to FIG. 3, an encapsulation layer is formed and cured over the substrate (block 325). In some cases, the encapsulation layer is a sol-gel layer made of the same sol-gel material used to form the sol-gel based structural layer. The encapsulation layer covers at least part of the micro-device deposited in a given void filling portions of the void not filled by the micro-device. This encapsulation layer maintains the micro-device in place while additional electronic structures are formed. Turning to FIG. 5d, an interim product 593 is shown that includes an encapsulation layer 518 securing micro-device 526 within void 542. Returning to FIG. 3, electrical structures are formed over the substrate including electrical top contacts to the micro-devices (block 330). Turning to FIG. 5e, an interim product 594 is shown that includes an an electrical contact layer 540 formed over substrate 202 such that contact is made with top layer 538 of micro-device 526.

Use of sol-gel to form a sol-gel based structural layer allows for tuning to achieve a variety of optical transmission characteristics. As just some examples, transmittance of greater than ninety (90) percent for wavelengths from three hundred fifty (350) nanometers to 800 nm is achievable using a sol-gel structural alignment layer ten (10) micrometers thick in embodiments described herein. This level of transmittance is better than that achievable through uses of photodefined polymers which are less than ninety (90) percent after thermal cycling to 400 C, and are generally much less than ninety (90) percent for wavelengths between three hundred fifty (350) nanometers and four hundred (400) nanometers. Further, the absorption that occurs in photodefined polymers at about six hundred eighty (680) nanometers is not exhibited in embodiments discussed herein.

In conclusion, the invention provides novel systems, devices, methods and arrangements for forming structures on a substrate. While detailed descriptions of one or more embodiments of the invention have been given above, various alternatives, modifications, and equivalents will be apparent to those skilled in the art without varying from the spirit of the invention. For example, while some embodiments are discussed in relation to forming wells for use in relation to fluidic assembly, it is noted that the embodiments find applicability to other structures including, but not limited to, surface roughening, fluidic steering features and/or other fluidic assembly features. Indeed, more generally, more generally embodiments in accordance with the present invention may be used to form sol-gel based structural layers to achieve tuned surface stiction by roughening or creating physical features. The formulation of the sol-gel can be specifically designed to focus on controlling properties such as stiction, optical scattering (increasing or decreasing), viscosity and compatibility with solution-based processing, cure speeds and methods, optical absorption at specific wavelengths (increasing or decreasing), refractive index, modulus, hardness, dielectric properties, and electronic device process compatibility. Therefore, the above description should not be taken as limiting the scope of the invention, which is defined by the appended claims.

What is claimed is:

1. An assembly panel, the panel comprising:

a substrate having a top surface;

an electronics structure layer disposed over the top layer of the substrate;

a sol-gel based structural layer disposed over the top layer of the substrate and the electronics structure layer, wherein the sol-gel based structural layer includes openings exposing at least a part of the electronics structure layer; and wherein the sol-gel based structural layer is formed of a material including at least two materials selected from a group consisting of: hydroxy(polydimethylsiloxane), methyltriethoxysilane, phenyltriethoxysilane, tetraethylorthosilicate, water, and octyltrichlorosilane.

2. The assembly panel of claim 1, wherein the electronics structure layer exhibits a first thickness and the sol-gel based structural layer exhibits a second thickness, and wherein the second thickness is at least three times thicker than the first thickness.

3. The assembly panel of claim 2, wherein the second thickness is at least five times thicker than the first thickness.

4. The assembly panel of claim 1, wherein the electronics structure layer includes an electrically conductive material connecting a bottom area of a first of the openings to a bottom area of a second of the openings.

5. The assembly panel of claim 1, wherein a material of the substrate is selected from a group consisting of: polymer, metal, ceramic, glass, and glass-ceramic.

6. The assembly panel of claim 1, wherein vias extend through the substrate from the bottom of a subset of the openings.

7. The assembly panel of claim 1, wherein the substrate is a multi-layer substrate.

8. A method for manufacturing a device, the method comprising:
providing a substrate; and
forming a sol-gel based structural layer over the substrate using a solution-based process, wherein the sol-gel structural layer includes features having varying feature depths.

9. The method of claim 8, wherein the solution-based process is a subtractive process.

10. The method of claim 8, wherein the varying feature depth includes openings in the sol-gel based structural layer through which an underlying layer is exposed.

11. The method of claim 10, wherein the method further comprises:
forming an electronics structure layer over the substrate prior to forming the sol-gel based structural layer over the substrate such that the sol-gel based structural layer covers at least a portion of the electronics structure layer; and
wherein the underlying layer is selected from a group consisting of: the electronics structure layer, and the top surface of the substrate.

12. The method of claim 11, the method further comprising:
using fluidic assembly to deposit micro-devices in the openings; and
forming an encapsulation layer over the sol-gel based structural layer and the micro-devices.

13. The method of claim 12, wherein the micro-devices are light emitting diodes.

14. The method of claim 12, wherein forming the encapsulation layer includes depositing a sol-gel material over the substrate, and curing the sol-gel material.

15. The method of claim 8, wherein the solution-based process is an additive process, and wherein the additive process is selected from a group of: a replication process, a stamping process, and a printing process.

16. The method of claim 8, wherein the solution-based process is an additive process, and wherein the additive process is a printing process, and wherein the printing process is selected from a group consisting of: screen printing, flexo printing, gravure printing, inkjet printing, and offset printing.

17. The method of claim 8, wherein the solution-based process is an additive process, and wherein the additive process includes curing a sol-gel material added over the substrate.

18. The method of claim 17, wherein curing the sol-gel material added over the substrate includes a process selected from a group consisting of: exposing the sol-gel material to ultraviolet radiation, and exposing the sol-gel material to thermal radiation.

19. The method of claim 8, wherein the method further comprises:
forming an electronics structure layer over the substrate prior to forming the sol-gel based structural layer over the substrate such that the sol-gel based structural layer covers at least a portion of the electronics structure layer.

20. The method of claim 8, wherein vias extend through the substrate from the bottom of a subset of the openings.

21. An electronic display device, the display device comprising:
a substrate;
an electronics structure layer formed over the substrate and including a first electrically conductive trace;
a sol-gel based structural layer formed over the substrate such that the sol-gel based structural layer covers a first portion of the electronics structure layer, wherein the sol-gel structural layer includes openings though which a second portion of the electronics structure layer is exposed, and wherein the first electrically conductive trace electrically connects the bottom of at least two of the openings;
light emitting diodes each within a respective one of the openings, wherein the light emitting diodes each include an upper electrical contact and a lower electrical contact, and wherein the lower electrical contact of a subset of the light emitting diodes is electrically connected to the first electrically conductive trace;
an encapsulation layer covering at least a portion of the sol-gel based structural layer and micro-devices; and
a second electrically conductive trace electrically connecting the upper electrical contacts of two or more of the light emitting diodes.

22. The electronic display device of claim 21, wherein the electronics structure layer exhibits a first thickness and the sol-gel based structural layer exhibits a second thickness, and wherein the second thickness is at least three times thicker than the first thickness.

23. The electronic display device of claim 22, wherein the second thickness is at least five times thicker than the first thickness.

24. The electronic display device of claim 21, wherein the sol-gel based structural layer is formed of a material including at least two materials selected from a group consisting of: a silane, a silicate, and water.

25. The electronic display device of claim 21, wherein the sol-gel based structural layer is formed of a material including at least two materials selected from a group consisting of: hydroxy(polydimethylsiloxane), methyltriethoxysilane, phenyltriethoxysilane, tetraethylorthosilicate, water, and octyltrichlorosilane.

26. The electronic display device of claim 21, wherein a material of the substrate is selected from a group consisting of: polymer, metal, ceramic, glass, and glass-ceramic.

27. The electronic display device of claim 21, wherein vias extend through the substrate from the bottom of a subset of the openings.

28. The electronic display device of claim 21, wherein the substrate is a multi-layer substrate.

29. An assembly panel, the panel comprising:
a substrate having a top surface;
a sol-gel based structural layer disposed adjacent to the top surface of the substrate;
an electronics structure layer disposed over the sol-gel based structural layer such that the electronics structure layer is separated from the substrate by the sol-gel structural layer; and
wherein no electronics exist between the sol-gel based structural layer and the top surface of the substrate.

30. The assembly panel of claim 29, wherein the sol-gel based structural layer is formed of a material including at least two materials selected from a group consisting of: a silane, a silicate, and water.

31. The assembly panel of claim 29, wherein the sol-gel based structural layer is formed of a material including at least two materials selected from a group consisting of: hydroxy(polydimethylsiloxane), methyltriethoxysilane, phenyltriethoxysilane, tetraethylorthosilicate, water, and octyltrichlorosilane.

32. The electronic display device of claim 29, wherein vias extend through the substrate from the bottom of a subset of the openings.

33. The electronic display device of claim 29, wherein the substrate is a multi-layer substrate.

34. An assembly panel, the assembly panel comprising:
a substrate; and
a solution-based structural layer disposed over the substrate having a thermal excursion capability of greater than three hundred degrees Celsius, an optical transmission of greater than eighty percent, a thickness of greater than two micrometers, and a Youngs modulus of greater than 20 GPa.

35. The assembly panel of claim 34, wherein the solution-based structural layer is made of a sol-gel material.

36. The assembly panel of claim 35, wherein the sol-gel material exhibits a feature resolution of less than ten micrometers for features having a depth of greater than fifty nanometers.

37. The assembly panel of claim 34, wherein the thermal excursion capability is greater than three hundred, fifty degrees Celsius, the optical transmission is greater than ninety percent, the thickness of greater than three micrometers, and the Youngs modulus is greater than 30 GPa.

38. An assembly panel, the panel comprising:
a substrate having a top surface;
an electronics structure layer disposed over the top layer of the substrate;
a sol-gel based structural layer disposed over the top layer of the substrate and the electronics structure layer, wherein the sol-gel based structural layer includes openings exposing at least a part of the electronics structure layer; and
wherein the sol-gel based structural layer is formed of a material including at least two materials selected from a group consisting of: a silane, a silicate, and water.

39. The assembly panel of claim 38, wherein vias extend through the substrate from the bottom of a subset of the openings.

40. An assembly panel, the panel comprising:
a substrate having a top surface;
an electronics structure layer disposed over the top layer of the substrate;
a sol-gel based structural layer disposed over the top layer of the substrate and the electronics structure layer, wherein the sol-gel based structural layer includes openings exposing at least a part of the electronics structure layer; and
wherein vias extend through the substrate from the bottom of a subset of the openings.

41. The assembly panel of claim 40, wherein the sol-gel based structural layer is formed of a material including at least two materials selected from a group consisting of: a silane, a silicate, and water.

42. The assembly panel of claim 40, wherein the sol-gel based structural layer is formed of a material including at least two materials selected from a group consisting of: hydroxy(polydimethylsiloxane), methyltriethoxysilane, phenyltriethoxysilane, tetraethylorthosilicate, water, and octyltrichlorosilane.

* * * * *